(12) United States Patent
Peng et al.

(10) Patent No.: US 6,800,510 B2
(45) Date of Patent: Oct. 5, 2004

(54) METHOD OF CONTROLLING STORAGE CAPACITOR'S CAPACITANCE OF THIN FILM TRANSISTOR LIQUID CRYSTAL DISPLAY

(75) Inventors: Chih-Yu Peng, Hsinchu (TW);
Wei-Chuan Lin, Taipei (TW);
Chian-Chih Hsiao, Taipei Hsien (TW);
Ta-Ko Chuang, Taichung (TW);
Chun-Hung Chu, Feng Yuan (TW);
Chih-Lung Lin, Taichung (TW);
Chin-Mao Lin, Chiayi (TW)

(73) Assignee: HannStar Display Corporation (TW)

( * ) Notice: Subject to any disclaimer, the term of this patent is extended or adjusted under 35 U.S.C. 154(b) by 0 days.

(21) Appl. No.: 10/289,470

(22) Filed: Nov. 6, 2002

(65) Prior Publication Data
US 2004/0084678 A1 May 6, 2004

(51) Int. Cl.⁷ .......................... H01L 21/00; H01L 21/84
(52) U.S. Cl. ...................... 438/149; 438/151; 438/155
(58) Field of Search ................ 438/149, 151, 438/155, 158; 257/49, 59, 72

(56) References Cited

U.S. PATENT DOCUMENTS 5,905,274 A * 5/1999 Ahn et al. .................. 257/59
6,485,997 B2 * 11/2002 Lee et al. ................... 438/30
6,649,933 B2 * 11/2003 Wong ......................... 257/59

* cited by examiner

*Primary Examiner*—Hoai Pham
(74) *Attorney, Agent, or Firm*—Knobbe Martens Olson & Bear LLP

(57) ABSTRACT

A method of controlling the capacitance of the TFT-LCD storage capacitor is provided. The gate dielectric layer of the TFT is composed of a silicon nitride layer, a dielectric layer and a silicon nitride layer, and the etching selectivity of the amorphous silicon layer over the dielectric layer is not less than about 5.0. Therefore, the dielectric layer can be an etching stop layer when a doped and an undoped amorphous silicon layers are etched to form source/drain stacked layers or a conductive layer is etched to form a gate on the gate dielectric layer. Hence, the dielectric layer thickness can be controlled; thereby the capacitance of the storage capacitor can be controlled.

6 Claims, 6 Drawing Sheets

METHOD OF CONTROLLING STORAGE CAPACITOR'S CAPACITANCE OF THIN FILM TRANSISTOR LIQUID CRYSTAL DISPLAY

BACKGROUND OF THE INVENTION

1. Field of Invention

The present invention relates to a method of fabricating a thin film transistor liquid crystal display (TFT-LCD). More particularly, the present invention relates to a method of controlling the capacitance of a TFT-LCD storage capacitor.

2. Description of Related Art

Liquid crystal display (LCD) has many advantages over other conventional types of displays including high display quality, small volume occupation, lightweight, low voltage driven and low power consumption. Hence, LCDs are widely used in small portable televisions, mobile telephones, video recording units, notebook computers, desktop monitors, projector televisions and so on. Therefore, LCD has gradually replaced the conventional cathode ray tube (CRT) as a mainstream display unit.

The gate dielectric layer of the thin film transistor in the TFT-LCD is generally a silicon nitride layer. When a source/drain stacked layer in a bottom gate structure or a gate in a top gate structure is formed on the gate dielectric layer, a short period of over-etching is performed to make sure that no residues are left on the gate dielectric layer. Since the area of the transparent substrate is very large, the thickness uniformity of the gate dielectric layer after over-etching on the entire transparent substrate is not good. Thus, the thickness uniformity of the storage capacitor dielectric layer in each pixel is also affected.

The storage electricity of the storage capacitor is used to compensate for the leakage current of the pixel electrode, and the pixel electrode voltage can therefore be maintained at a stable level to stabilize the arrangement of liquid crystal molecules to stabilize the display of LCD. If the capacitances of the capacitors on the transparent substrate are varied, the charging or discharging rates are also varied. Therefore, the TFT dimensions cannot be designed according to the ideal condition that each storage capacitor has the same capacitance. To insure that a storage capacitor with less sufficient capacitance can normally charge and discharge in a regular time period, the TFT dimensions have to be designed large enough to enable the poorest storage capacitor to function normally. Therefore, the stability of the TFT-LCD display can be maintained. However, the aperture ratio of each pixel in TFT-LCD is decreased.

SUMMARY OF THE INVENTION

It is therefore an objective of the present invention to provide a method of controlling the capacitance of the TFT-LCD storage capacitor to control the uniformity of the storage capacitor's dielectric layer.

It is another objective of the present invention to provide a method of controlling the capacitance of the TFT-LCD storage capacitor to improve the uniformity of the storage capacitor's capacitance.

It is still another objective of the present invention to provide a method of controlling the capacitance of the TFT-LCD storage capacitor to reduce TFTs' dimensions.

It is again another objective of the present invention to provide a method of controlling the capacitance of the TFT-LCD storage capacitor to elevate the aperture ratio of the liquid crystal display.

In accordance with the foregoing and other objectives of the present invention, a method of controlling the capacitance of the TFT-LCD storage capacitor is provided. The method comprises the following steps. A first conductive layer is formed on a transparent substrate and then is patterned to form a gate and a bottom electrode. A first silicon nitride layer, a dielectric layer, a second silicon nitride layer, an undoped amorphous silicon layer, and a doped amorphous silicon layer are sequentially formed on the transparent substrate, and an etching selectivity ratio of amorphous silicon over a material of the dielectric layer is not less than about 5.0. The doped amorphous silicon layer, the undoped amorphous silicon layer, and the second silicon nitride layer are patterned to form a stacked layer on the dielectric layer over the gate. A second conductive layer is formed on the transparent substrate. Then, the second conductive layer and the doped amorphous silicon layer are patterned to form a source and a drain on either side of the gate. Next, a passivation layer is formed over the transparent substrate and then is patterned to form a contact window to expose the source or the drain. A transparent conductive layer is formed on the passivation layer and in the contact window. The transparent conductive layer then is patterned to form a pixel electrode to connect the exposed source or the drain through the contact window electrically, and a storage capacitor is formed by the overlap between the pixel electrode and the bottom electrode.

In accordance with the foregoing and other objectives of the present invention, another method of controlling the capacitance of the TFT-LCD storage capacitor is provided. The method comprises the following steps. A first conductive layer is formed on a transparent substrate and then is patterned to form a gate and a bottom electrode on the transparent substrate. A first silicon nitride layer, a dielectric layer, a second silicon nitride layer, an undoped amorphous silicon layer, and an etching stop layer are sequentially formed on the transparent substrate, and an etching selectivity ratio of amorphous silicon over a material of the dielectric layer is not less than about 5.0. The etching stop layer is patterned to form an etching mask on the undoped amorphous silicon layer over the gate. A doped amorphous silicon layer and a second conductive layer are sequentially formed over the transparent substrate. Then, the second conductive layer, the doped amorphous silicon layer, the undoped amorphous silicon layer, and the second silicon nitride layer are sequentially patterned to form a source and a drain on either side of the gate, and the undoped amorphous silicon layer serves as a channel between the source and the drain. A passivation layer is formed over the transparent substrate and then is patterned to form a contact window therein to expose the source or the drain. A transparent conductive layer is formed on the passivation layer and in the contact window. Then, the transparent conductive layer is patterned to form a pixel electrode to connect the exposed source or drain electrically through the contact window, and a storage capacitor is formed by the overlap between the pixel electrode and the bottom electrode.

In accordance with the foregoing and other objectives of the present invention, still another method of controlling the capacitance of the TFT-LCD storage capacitor is provided. The method comprises the following steps. An undoped amorphous silicon layer is formed on a transparent substrate and then is patterned to form a silicon island of the TFT and a bottom electrode of the storage capacitor on the transparent substrate. A first silicon nitride layer, a dielectric layer, a second silicon nitride layer, and a first conductive layer are sequentially formed on the transparent substrate, and an etching selectivity ratio of amorphous silicon over a material of the dielectric layer is not less than about 5.0. Then, the first conductive layer and the second silicon nitride layer are patterned to form a stacked layer on the central part of the silicon island, and the first conductive layer of the stacked layer serves as a gate of a thin film transistor. The gate is used as a mask to implant ions into the silicon island under both sides of the gate to form a source and a drain of the thin film transistor and implant ions into the bottom electrode. A passivation layer is formed over the transparent substrate. The passivation layer, the dielectric layer and the first silicon nitride layer then are patterned to form a first contact window to expose the source and a second contact window to expose the drain. A second conductive layer is formed over the transparent substrate and then is patterned to form a data line connecting the source through the first contact window. A transparent conductive layer is formed over the transparent substrate. The transparent conductive layer is patterned to form a pixel electrode connecting the drain through the second contact window, and a storage capacitor is formed by the overlap between the pixel electrode and the bottom electrode.

In the foregoing, the dielectric layer is, for example, a silicon oxide layer, a tantalum oxide layer, an aluminum oxide layer or a barium titanate layer.

In conclusion, the invention allows the dielectric layer to be an etch stop layer when the stacked layer is formed, and the remaining dielectric layer and the first silicon nitride layer thus have a uniform thickness. Therefore, the storage capacitor, which comprises overlapping parts of the bottom electrode, the first silicon nitride layer, the dielectric layer, the passivation layer and the pixel electrode, has a uniform dielectric layer, which comprises the first silicon nitride layer, the dielectric layer, and the passivation layer. As a result, the capacitance of the storage capacitor is also uniform to allow a smaller dimension of the thin film transistor. Hence, the aperture ratio of each pixel is increased to improve the display quality.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
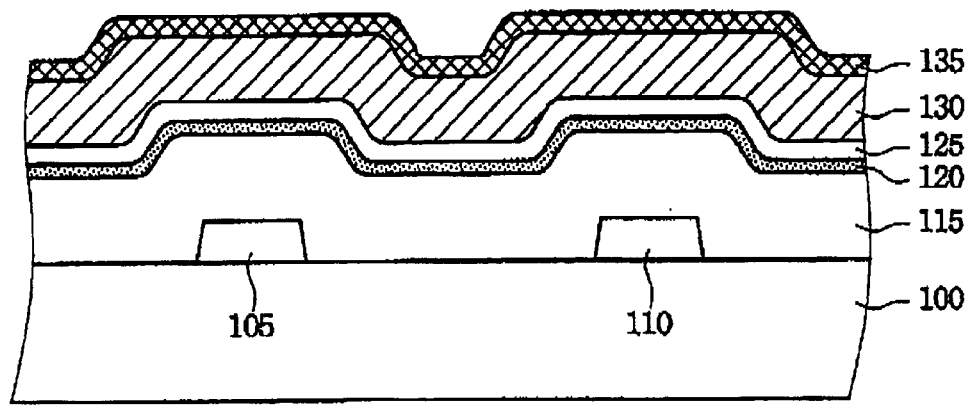
FIGS. 1A–1D are schematic, cross-sectional views showing a process for controlling the capacitance of the TFT-LCD storage capacitor according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

As described above, this invention provides a method of controlling the capacitance of the TFT-LCD storage capacitor. This method controls the thickness uniformity of the storage capacitor's dielectric layer and thereby the effects of increasing uniformity of the storage capacitor's capacitance, reducing the dimensions of TFT, and increasing the aperture ratio of the LCD are reached.

Embodiment 1

FIGS. 1A–1D are schematic, cross-sectional views showing a process for controlling the capacitance of the TFT-LCD storage capacitor according to a first preferred embodiment of this invention. In FIG. 1A, a first conductive layer is formed on a transparent substrate 100 and then is patterned to form a gate 105 and a bottom electrode 110 respectively on the transparent substrate 100. Then, a first silicon nitride layer 115, a dielectric layer 120, a second silicon nitride layer 125, an undoped amorphous silicon layer 130, and a doped amorphous silicon layer 135 are sequentially formed on the transparent substrate.

The material of the first conductive layer is, for example, copper, aluminum, chromium or alloy of molybdenum and tungsten, and the first conductive layer can be formed by a physical vapor deposition process such as sputtering. The first silicon nitride layer 115 and the second silicon nitride layer 125 can be formed by chemical vapor deposition; the preferable thicknesses of the first silicon nitride layer 115 and the second silicon nitride layer 125 are respectively about 1500–3500 Å and about 200–800 Å, and their more preferable thicknesses are respectively about 2000–3000 Å and about 400–600 Å. An etching selectivity ratio of amorphous silicon over the material of the dielectric layer 120 is not less than about 5.0. The material of the dielectric layer 120 is, for example, silicon oxide or dielectric material, such as tantalum oxide, aluminum oxide or barium titanate, having a dielectric constant larger than about 4.0. The dielectric layer 120 is formed by chemical vapor deposition; its preferable thickness is about 100–600 Å, and its more preferable thickness is about 200–400 Å.

Figure 1B:
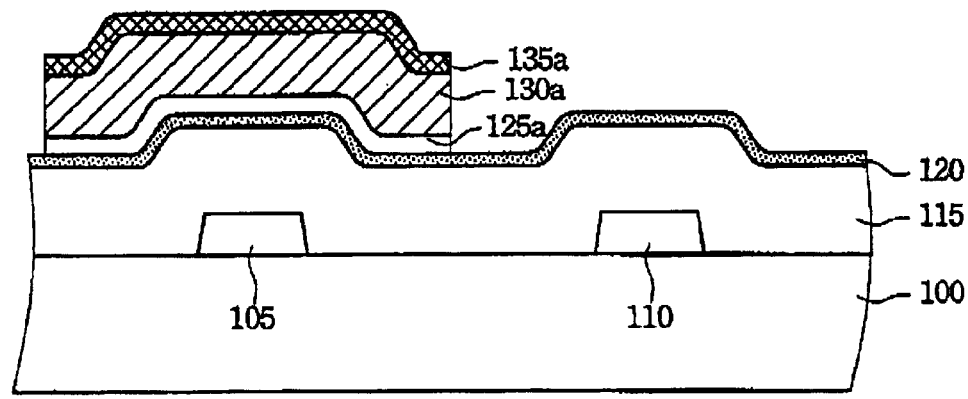

In FIG. 1B, the doped amorphous silicon layer 135, the undoped amorphous silicon layer 130, and the second silicon nitride layer 125 are patterned to form a stacked layer on the dielectric layer 120 over the gate 105. The stacked layer comprises the doped amorphous silicon layer 135a, the undoped amorphous silicon layer 130a, and the second silicon nitride layer 125a. The patterning method is, for example, lithography and etching.

Figure 1C:
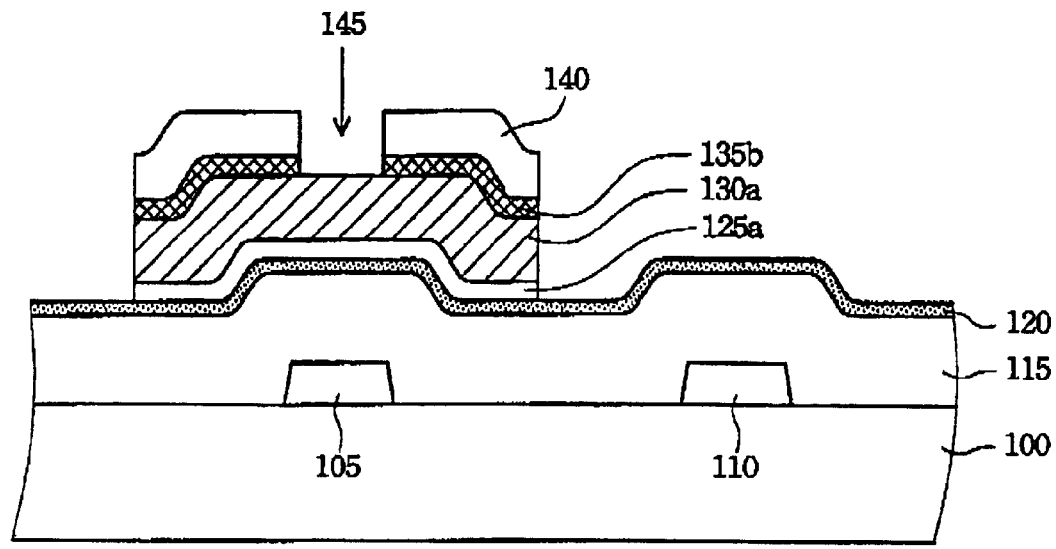

In FIG. 1C, a second conductive layer is formed on the transparent substrate 100. Then, the second conductive layer is patterned to form source/drains 140 over both sides of the gate 105. Then, the doped amorphous silicon layer 135a exposed by opening 145 is etched to form lightly doped drains 135b. The material of the second conductive layer is, for example, copper, aluminum, chromium or alloy of molybdenum and tungsten, and the second conductive layer is formed by a physical vapor deposition process such as sputtering.

Figure 1D:
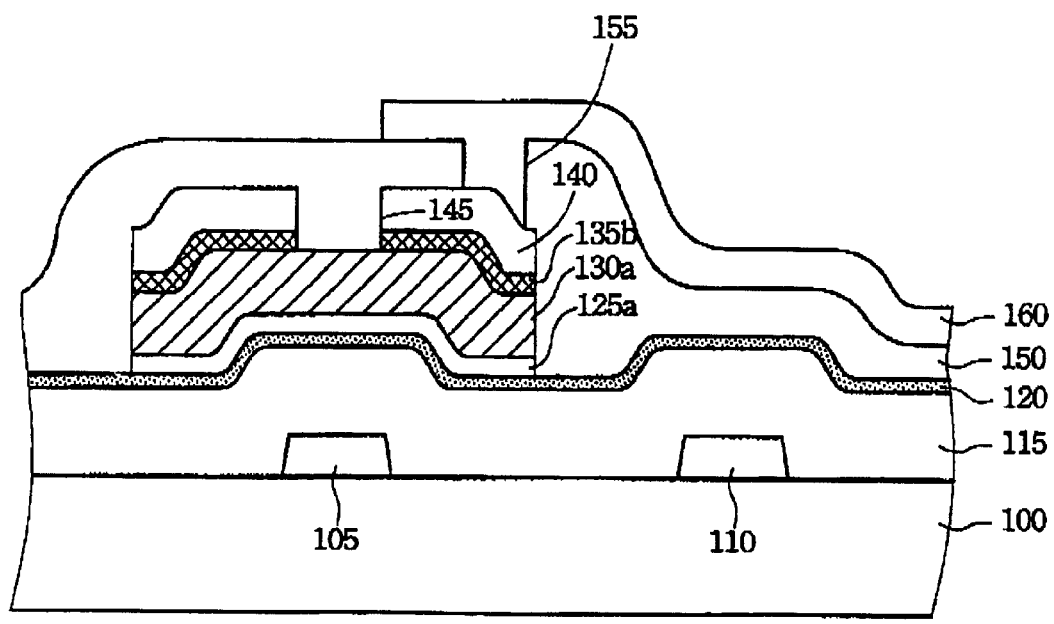

In FIG. 1D, a passivation layer 150 is formed over the transparent substrate 100 and then is patterned to form a contact window 155 to expose the source/drain 140 on the right side. A transparent conductive layer is formed on the passivation layer 150 and in the contact window 155. The transparent conductive layer then is patterned to form a pixel electrode 160 to connect the exposed source/drain 140 through the contact window 155 electrically. A storage capacitor of the thin film transistor is formed by the overlap between the pixel electrode 160 and the bottom electrode 110, and hence the storage capacitor's dielectric layer includes the passivation layer 150, the dielectric layer 120, and the first silicon nitride layer 115 between the pixel electrode 160 and the bottom electrode 110. The material of the above-mentioned transparent conductive layer is, for example, indium tin oxide or indium zinc oxide, and the transparent conductive layer is formed by, for example, a physical vapor deposition process such as reactive sputtering.

Embodiment 2

Figure 2A:
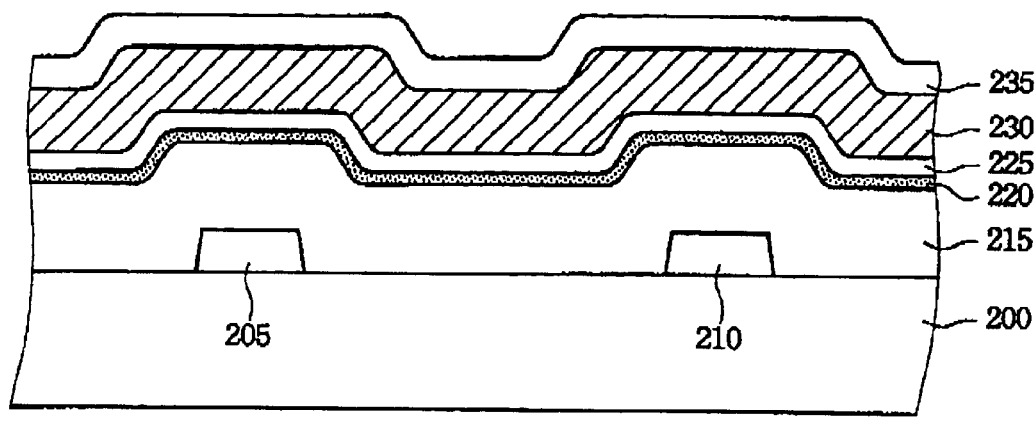
FIGS. 2A–2C are schematic, cross-sectional views showing a process for controlling the capacitance of the TFT-LCD storage capacitor according to another preferred embodiment of this invention.
Figure 2B:
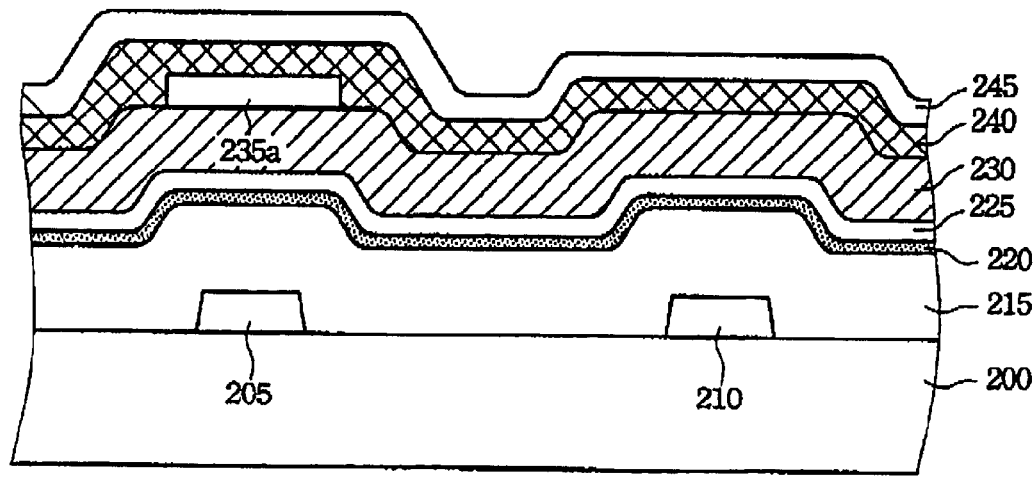
Figure 2C:
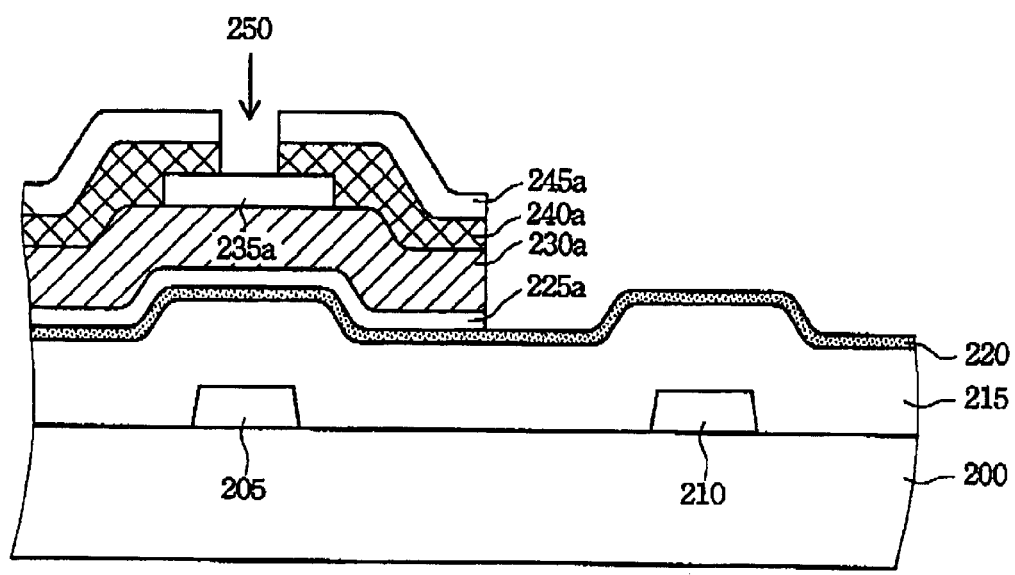

FIGS. 2A–2C are schematic, cross-sectional views showing a process for controlling the capacitance of the TFT-LCD storage capacitor according to a second preferred embodiment of this invention. In FIG. 2A, a first conductive layer is formed on a transparent substrate 200 and then is patterned to form a gate 205 and a bottom electrode 210 on the transparent substrate 200. A first silicon nitride layer 215, a dielectric layer 220, a second silicon nitride layer 225, an undoped amorphous silicon layer 230, and an etching stop layer 235 are sequentially formed on the transparent substrate 200.

The material of the first conductive layer is, for example, copper, aluminum, chromium or alloy of molybdenum and tungsten, and the first conductive layer is formed by a physical vapor deposition process such as sputtering. The first silicon nitride layer 215 and the second silicon nitride layer 225 is formed by chemical vapor deposition; the preferable thicknesses of the first silicon nitride layer 215 and the second silicon nitride layer 225 are respectively about 1500–3500 Å and about 200–800 Å, and their more preferable thicknesses are respectively about 2000–3000 Å and about 400–600 Å. An etching selectivity ratio of amorhous silicon over the material of the dielectric layer 220 is not less than about 5.0. The material of the dielectric layer 220 is, for example, silicon oxide or dielectric material, such as tantalum oxide, aluminum oxide or barium titanate, having a dielectric constant larger than about 4.0. The dielectric layer 220 is formed by chemical vapor deposition; its preferable thickness is about 100–600 Å, and its more preferable thickness is about 200–400 Å. The etching stop layer 235 is formed by chemical vapor deposition, and it is, for example, a silicon nitride layer or a silicon oxide/silicon nitride composite layer. The preferable thickness of the etching stop layer 235 is about 200–400 Å.

In FIG. 2B, the etching stop layer 235 is patterned to form an etching mask 235a on the undoped amorphous silicon layer 230 over the gate 205. Then, a doped amorphous silicon layer 240 and a second conductive layer 245 are sequentially formed over the transparent substrate 200. The material of the second conductive layer 245 is, for example, copper, aluminum, chromium or alloy of molybdenum and tungsten, and the second conductive layer is formed by a physical vapor deposition process such as sputtering.

In FIG. 2C, the second conductive layer 245, the doped amorphous silicon layer 240, the undoped amorphous silicon layer 230, and the second silicon nitride layer 225 are sequentially patterned to form a stacked layer and an opening 250 in the stacked layer. The stacked layer comprises a second silicon nitride layer 225a, a channel 230a, two lightly doped drain 240a, and two source/drains 245a. Since the etching mask 235a protects the undoped amorphous silicon layer 230a, the etching to form opening 250 can stop on the etching mask 235a to avoid damaging the undoped amorphous silicon layer 230a. The patterning method mentioned above is, for example, lithography and etching. The following processes are similar to those of Embodiment 1 and hence are omitted here.

Embodiment 3

Figure 3A:
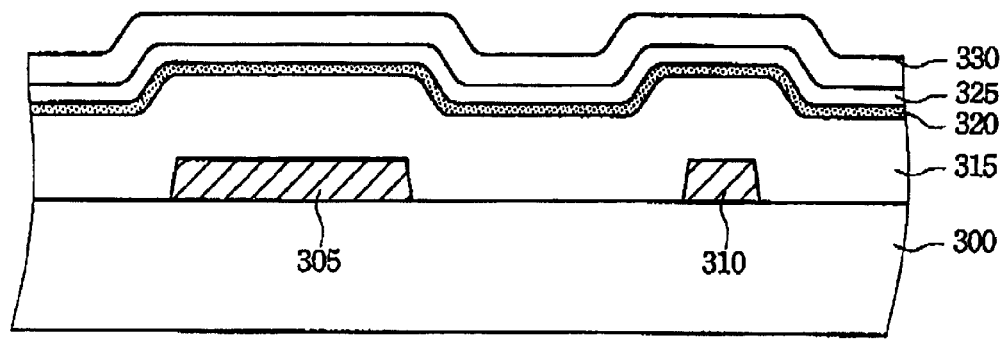
FIGS. 3A–3C are schematic, cross-sectional views showing a process for controlling the capacitance of the TFT-LCD storage capacitor according to still another preferred embodiment of this invention.
Figure 3B:
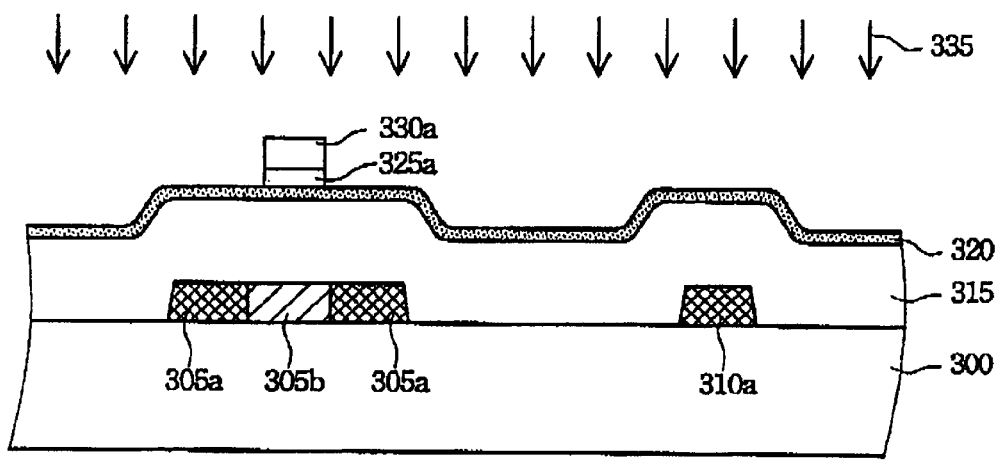
Figure 3C:
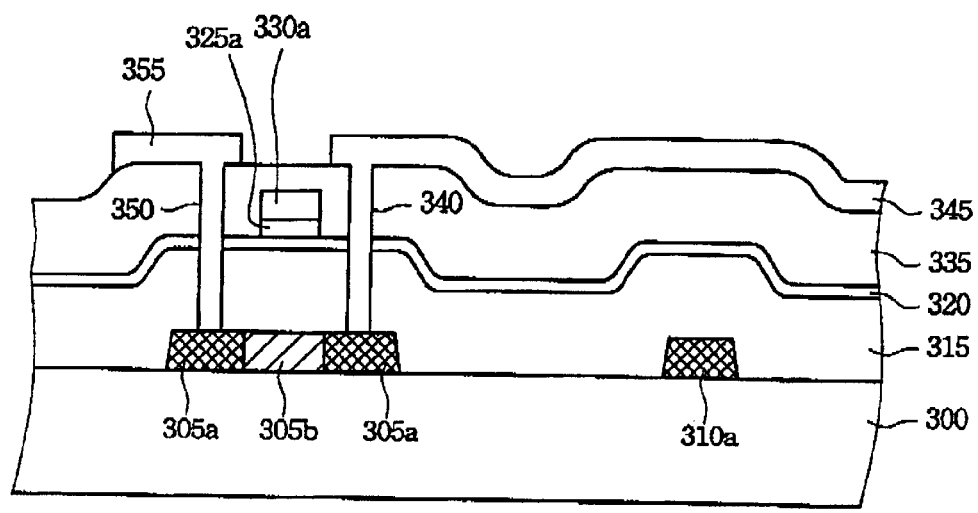

FIGS. 3A–3C are schematic, cross-sectional views showing a process of controlling the capacitance of the TFT-LCD storage capacitor according to a third preferred embodiment of this invention. In FIG. 3A, an undoped amorphous silicon layer is formed on a transparent substrate 300 and then is patterned to form a silicon island 305 and a bottom electrode 310 on the transparent substrate 300. A first silicon nitride layer 315, a dielectric layer 320, a second silicon nitride layer 325, and a first conductive layer 330 are sequentially formed on the transparent substrate 300.

The first silicon nitride layer 315 and the second silicon nitride layer 325 is formed by chemical vapor deposition; the preferable thicknesses of the first silicon nitride layer 315 and the second silicon nitride layer 325 are respectively about 1500–3500 Å and about 200–800 Å, and their more preferable thicknesses are respectively about 2000–3000 Å and about 400–600 Å. An etching selectivity ratio of amorphous silicon over the material of the dielectric layer 320 is not less than about 5.0. The material of the dielectric layer 320 is, for example, silicon oxide or a dielectric material, such as tantalum oxide, aluminum oxide or barium titanate, having a dielectric constant larger than about 4.0. The dielectric layer 320 is formed by chemical vapor deposition; its preferable thickness is about 100–600 Å, and its more preferable thickness is about 200–400 Å. The material of the first conductive layer is, for example, copper, aluminum, chromium or alloy of molybdenum and tungsten, and the first conductive layer is formed by a physical vapor deposition process such as sputtering.

In FIG. 3B, the first conductive layer 330 and the second silicon nitride layer 325 are patterned to form a stacked layer comprising a second silicon nitride layer 325a and a gate 330a on the central part of the silicon island 305. Then, the gate 330a is used as a mask to implant ions into the silicon island 305 under both sides of the gate 330a and the bottom electrode 310 to form two source/drains 305a, channel 305b of the thin film transistor and the bottom electrode 310a.

In FIG. 3C, a passivation layer 335 is formed over the transparent substrate 300, and the passivation layer 335, the dielectric layer 320 and the first silicon nitride layer 315 then are patterned to form contact windows 340 and 350 to expose both of the source/drains 305a. Next, a second conductive layer is formed over the transparent substrate and is patterned to form a data line 355 connecting the source/drain 305a on the left side through the contact window 350. A transparent conductive layer is formed over the transparent substrate 300. The transparent conductive layer is patterned to form a pixel electrode 345 connecting the source/drain 305a on the right side through the contact window 340. A storage capacitor of the thin film transistor is formed by the overlap between the pixel electrode 345 and the bottom electrode 310a, and hence the storage capacitor's dielectric layer includes the passivation layer 335, the dielectric layer 320, and the first silicon nitride layer 315 between the pixel electrode 345 and the bottom electrode 310a. The material of the above-mentioned transparent conductive layer is, for example, indium tin oxide or indium zinc oxide, and the transparent conductive layer is, for example, a physical vapor deposition process such as reactive sputtering.

From the preferred embodiments mentioned above, it is evident that the gate dielectric layer of the thin film transistor is replaced by the composite gate dielectric layer comprising the first silicon nitride layer, the dielectric layer and the second silicon nitride layer in this invention. Therefore, when the undoped amorphous silicon layer/doped amorphous silicon layer in the bottom gate design are etched to form the stacked layer or the conductive layer in the top gate design is etched to form the gate, the dielectric layer is used as an etching stop layer. Therefore, the thickness of the remaining gate dielectric layer over the entire transparent substrate is quite uniform after over-etching, and storage capacitors with uniform capacitance on the entire transparent substrate is obtained after the subsequent steps of depositing the passivation layer and forming the pixel electrodes.

The etching selectivity of an amorphous silicon layer over a silicon nitride layer is about 3.0–5.0, and the etching selectivity of an amorphous silicon layer over a silicon oxide layer is about 5.0–10.0. If the gate dielectric layer being a silicon nitride layer compares with the gate dielectric layer comprising a first silicon nitride layer, a silicon oxide layer and a second silicon nitride layer in a bottom gate designed thin film transistor, the result after over-etching is as follows. In the case where the gate dielectric layer is a silicon nitride layer, the thickness uniformity is about 5% over entire transparent substrate after depositing the silicon nitride layer by chemical vapor deposition; the thickness uniformity is reduced to about 20% after over-etching. However, in the case where the gate dielectric layer comprising a first silicon nitride layer, a silicon oxide layer and a second silicon nitride layer, the thickness uniformity is about 5% over the entire transparent substrate after depositing the first silicon nitride layer, the silicon oxide layer and the second silicon nitride layer by chemical vapor deposition; the thickness uniformity is still maintained at about 5% after over-etching. In addition, the thickness uniformity is also about 5% after depositing the passivation layer, and the storage capacitor's capacitance is maintained at a quite good uniformity over the entire transparent substrate.

Furthermore, if a dielectric layer with a dielectric constant larger than 4.0 is used, the storage capacitor's capacitance is increased. Therefore, the dimensions of the thin film transistor is further reduced to increase the aperture ratio of the liquid crystal display to improve the display quality.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of controlling a capacitance of a TFT-LCD storage capacitor, comprising the steps of:

forming a first conductive layer on a transparent substrate;

patterning the first conductive layer to form a gate and a bottom electrode on the transparent substrate;

forming a first silicon nitride layer on the transparent substrate;

forming a dielectric layer on the first silicon nitride layer;

forming a second silicon nitride layer on the dielectric layer;

forming an undoped amorphous silicon layer on the second silicon nitride layer;

forming a doped amorphous silicon layer on the undoped amorphous silicon layer, wherein an etching selectivity ratio of the undoped and doped amorphous silicon layers over the dielectric layer is not less than about 5.0;

sequentially patterning the doped amorphous silicon layer, the undoped amorphous silicon layer, and the second silicon nitride layer to form a stacked layer on the dielectric layer over the gate;

forming a second conductive layer on the transparent substrate;

sequentially patterning the second conductive layer and the doped amorphous silicon layer to form a source and a drain on either side of the gate;

forming a passivation layer over the transparent substrate;

patterning the passivation layer to form a contact window to expose the source or drain;

forming a transparent conductive layer on the passivation layer and in the contact window; and patterning the transparent conductive layer to form a pixel electrode to connect the exposed source or drain through the contact window electrically, and an overlap between the pixel electrode and the bottom electrode forming a storage capacitor.

2. The method of claim 1, wherein the dielectric layer comprises a silicon oxide layer.

3. The method of claim 1, wherein a dielectric constant of the dielectric layer is larger than about 4.0.

4. The method of claim 1, wherein the dielectric layer is selected from a group consisting of a tantalum oxide layer, an aluminum oxide layer and a barium titanate layer.

5. The method of claim 1, wherein the passivation layer comprises a silicon nitride layer.

6. The method of claim 1, wherein the transparent conductive layer comprises an indium tin oxide layer or an indium zinc oxide layer.

* * * * *